US012690336B2

(12) United States Patent
Wang

(10) Patent No.: US 12,690,336 B2
(45) Date of Patent: Jul. 21, 2026

(54) DISPLAY PANEL COMPRISING A PIXEL DEFINITION LAYER, DISPLAY DEVICE AND METHOD FOR PREPARING DISPLAY PANEL

(71) Applicants: HEFEI BOE JOINT TECHNOLOGY CO., LTD., Hefei (CN); BOE TECHNOLOGY GROUP CO., LTD., Beijing (CN)

(72) Inventor: Huifeng Wang, Beijing (CN)

(73) Assignees: Hefei BOE Joint Technology Co., Ltd., Hefei (CN); BOE Technology Group Co., Ltd., Beijing (CN)

(*) Notice: Subject to any disclaimer, the term of this patent is extended or adjusted under 35 U.S.C. 154(b) by 387 days.

(21) Appl. No.: 18/272,014

(22) PCT Filed: Nov. 26, 2021

(86) PCT No.: PCT/CN2021/133378
§ 371 (c)(1),
(2) Date: Jul. 12, 2023

(87) PCT Pub. No.: WO2023/092436
PCT Pub. Date: Jun. 1, 2023

(65) Prior Publication Data
US 2024/0090270 A1 Mar. 14, 2024

(51) Int. Cl.
*H10K 59/12* (2023.01)
*H10K 59/122* (2023.01)
*H10K 59/80* (2023.01)

(52) U.S. Cl.
CPC ....... *H10K 59/122* (2023.02); *H10K 59/1201* (2023.02); *H10K 59/80522* (2023.02)

(58) Field of Classification Search
CPC ............. H10K 59/122; H10K 59/1201; H10K 59/80522
(Continued)

(56) References Cited

U.S. PATENT DOCUMENTS

2007/0200488 A1 8/2007 Ito
2014/0346459 A1 11/2014 Song et al.
(Continued)

FOREIGN PATENT DOCUMENTS

CN 103311269 A 9/2013
CN 108807457 A 11/2018
(Continued)

OTHER PUBLICATIONS

International Search Report and Written Opinion issued in International Patent Application No. PCT/CN2021/133378, mailed Aug. 18, 2022, with partial English translation, 9 pages.

*Primary Examiner* — Phuc T Dang
(74) *Attorney, Agent, or Firm* — Armstrong Teasdale LLP

(57) ABSTRACT
An embodiment of the present disclosure relates to a display panel including a pixel definition layer which includes a plurality of first pixel definition strips extending in a first direction and arranged at intervals in a second direction perpendicular to the first direction; a plurality of second pixel definition strips extending in the second direction and arranged at intervals in the first direction, wherein at least one of the plurality of second pixel definition strips has at least one widened part which has a width greater than a width of the remaining part of the second pixel definition strip, wherein the width of the widened part is a maximum width of a cross-section of the widened part; and an auxiliary electrode hole disposed in the at least one widened parts. Embodiments of the present disclosure further relate to a display device and a method for preparing a display panel.

20 Claims, 7 Drawing Sheets

(58) Field of Classification Search
USPC .......................................................... 257/72
See application file for complete search history.

(56) References Cited

U.S. PATENT DOCUMENTS

| | | | |
|---|---|---|---|
| 2016/0043150 A1 | 2/2016 | Wang et al. | |
| 2016/0063341 A1 | 3/2016 | Ogata et al. | |
| 2019/0006443 A1 | 1/2019 | Hanashima | |
| 2019/0035865 A1* | 1/2019 | Cui ........................ | H10K 50/15 |
| 2019/0326376 A1 | 10/2019 | Huo | |
| 2020/0243621 A1 | 7/2020 | Zhao | |
| 2022/0069036 A1 | 3/2022 | Huang | |
| 2022/0123077 A1 | 4/2022 | Cui | |

FOREIGN PATENT DOCUMENTS

| | | | | |
|---|---|---|---|---|
| CN | 109273516 A | 1/2019 | | |
| CN | 109713162 A | 5/2019 | | |
| CN | 111653685 A | 9/2020 | | |
| CN | 112002817 A | 11/2020 | | |
| CN | 112234085 A | 1/2021 | | |
| CN | 113270461 A | 8/2021 | | |
| KR | 20200041824 A * | 4/2020 | ............. | H01L 27/32 |
| WO | WO-2022204918 A1 * | 10/2022 | ............. | H10K 71/00 |

* cited by examiner

First direction
Second direction
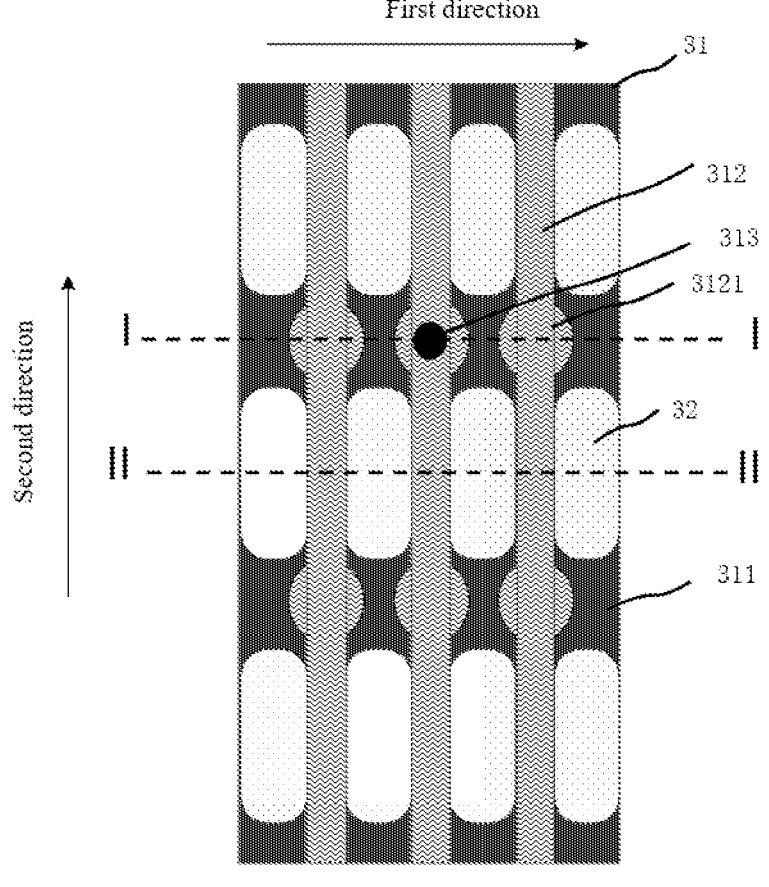
FIG. 5A
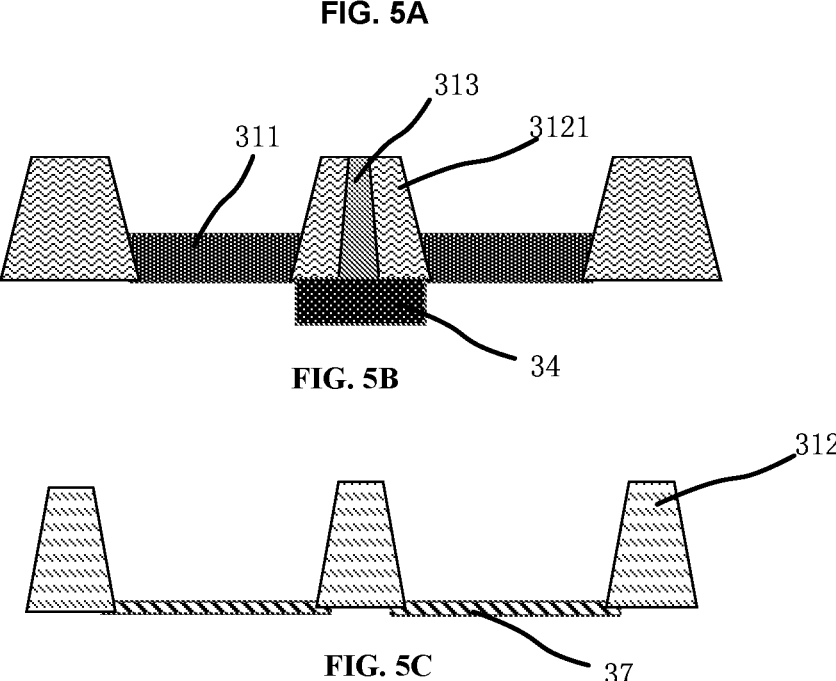
FIG. 5B
FIG. 5C

700

DISPLAY PANEL COMPRISING A PIXEL DEFINITION LAYER, DISPLAY DEVICE AND METHOD FOR PREPARING DISPLAY PANEL

CROSS REFERENCE TO RELATED APPLICATIONS

This patent application is a National Stage Entry of PCT/CN2021/133378 filed on Nov. 26, 2021, the disclosure of which is incorporated by reference herein in its entirety as part of the present application.

BACKGROUND

The present disclosure relates to the field of display technology, and in particular, to a display panel, a display device and a method for preparing a display panel.

An Organic Light-Emitting Diode (OLED) display device, also known as an organic electroluminescent display device, is a different display device from the traditional liquid crystal display (LCD). Such display technology has the advantages of simple structure, self-luminescence, high contrast, thin thickness, wide viewing angle, fast response time, continuously adjustable luminous color, and being usable in a flexible panel, etc. Therefore, it has become one of the important development directions of a new generation of display devices, and has received more and more attention.

BRIEF DESCRIPTION

Embodiments of the present disclosure provide a display panel, a display device, and a method for preparing a display panel.

An aspect of the present disclosure provides a display panel including a pixel definition layer which includes a plurality of first pixel definition strips extending in a first direction and arranged at intervals in a second direction perpendicular to the first direction; a plurality of second pixel definition strips extending in the second direction and arranged at intervals in the first direction, wherein at least one of the plurality of second pixel definition strips has at least one widened part which has a width greater than a width of a remaining part of the respective second pixel definition strip to which the widened part belongs, wherein the width of the widened part is a maximum width, in the first direction, of a cross section of the widened part parallel to both the first direction and the second direction; and an auxiliary electrode hole disposed in the at least one widened part.

In one or more embodiments of the present disclosure, the display panel further includes a substrate; an auxiliary electrode disposed between the substrate and the pixel definition layer; and a first electrode disposed on a side of the pixel definition layer away from the substrate, wherein the auxiliary electrode is electrically connected to the first electrode via a conductive material deposited in the auxiliary electrode hole.

In one or more embodiments of the present disclosure, at least one of the plurality of second pixel definition strips has a thickness in a third direction perpendicular to the first direction and the second direction greater than a thickness of at least one of the plurality of first pixel definition strips.

In one or more embodiments of the present disclosure, the thickness of the first pixel definition strip is in the range of 0.1-1.0 μm, and the thickness of the second pixel definition strip is in the range of 0.5-50 μm.

In one or more embodiments of the present disclosure, the at least one widened part is located at intersection positions of the plurality of second pixel definition strips and the plurality of first pixel definition strips.

In one or more embodiments of the present disclosure, each of the intersection positions of the plurality of second pixel definition strips and the plurality of first pixel definition strips is provided with the widened part.

In one or more embodiments of the present disclosure, the number of the widened parts provided with the auxiliary electrode holes is not less than 0.001-1 times the total number of pixel regions defined by the plurality of first pixel definition strips and the plurality of second pixel definition strips.

In one or more embodiments of the present disclosure, a shape of the cross-section of the widened part is designed such that a width of a channel formed between adjacent second pixel definition strips gradually increases from the middle of the widened part toward the any side of the widened part.

In one or more embodiments of the present disclosure, the cross section of the widened part parallel to both the first direction and the second direction is one or more of a circle, an ellipse, a regular rectangle, a rounded rectangle, a hexagon, or a rhombus.

In one or more embodiments of the present disclosure, the width of the widened part is designed such that a minimum width of the channel formed between the widened parts of the adjacent second pixel definition strips is not less than ⅓ of a width of a pixel region defined by the pixel definition layer between the adjacent second pixel definition strips.

In one or more embodiments of the present disclosure, the width of the remaining part of each of the second pixel definition strips is in the range of 5-15 μm, and a difference between the width of the widened part of each of the second pixel definition strips and the width of the remaining part is in the range of 1-100 μm.

In one or more embodiments of the present disclosure, the auxiliary electrode hole has a same cross-sectional shape as the respective widened part where the auxiliary electrode hole is disposed.

In one or more embodiments of the present disclosure, the width of the widened part and the width of the auxiliary electrode hole gradually increase in a direction from the first electrode toward the auxiliary electrode.

In one or more embodiments of the present disclosure, of the widened part and the auxiliary electrode hole have trapezoidal longitudinal cross sections perpendicular to both the first direction and the second direction.

In one or more embodiments of the present disclosure, the plurality of first pixel definition strips include a hydrophilic material and the plurality of second pixel definition strips include a hydrophobic material.

In one or more embodiments of the present disclosure, the hydrophilic material includes polyimide or acrylic, and the hydrophobic material includes fluorinated polyimide or sulfonimide.

In one or more embodiments of the present disclosure, the display panel further includes a thin film transistor array including a plurality of thin film transistors disposed on the substrate; a second electrode disposed on a side of the thin film transistor array away from the substrate, the second electrode including a plurality of second sub-electrodes, whose orthographic projections on the substrate respectively overlap orthographic projections on the substrate, of a plurality of pixel regions defined by the pixel definition layer; and a light emitting material layer disposed on a side of the plurality of second sub-electrodes away from the substrate, wherein the first electrode is disposed on a side of the light emitting material layer away from the substrate.

In one or more embodiments of the present disclosure, the auxiliary electrode is insulatedly disposed in a same layer as any of the second electrode, a source/drain electrode of the thin film transistor, or a gate of the thin film transistor.

Another aspect of the present disclosure provides a display device including a display panel as described in any of one or more embodiments of the present disclosure.

Yet another aspect of the present disclosure provides a method for preparing a display panel including providing a substrate; forming a pixel definition layer on the substrate, the pixel definition layer including a plurality of first pixel definition strips extending in a first direction and arranged at intervals in a second direction perpendicular to the first direction; a plurality of second pixel definition strips extending in the second direction and arranged at intervals in the first direction, wherein at least one of the plurality of second pixel definition strips has at least one widened part which has a width greater than a width of a remaining part of the respective second pixel definition strip to which the widened part belongs, wherein the width of the widened part is a maximum width, in the first direction, of a cross section of the widened part parallel to both the first direction and the second direction; and an auxiliary electrode hole disposed in the at least one widened part.

Further aspects and areas of applicability will become apparent from the description provided herein. It should be understood that various aspects of this application may be implemented individually or in combination with one or more other aspects. It should also be understood that the description and specific examples herein are intended for purposes of illustration only and are not intended to limit the scope of the present application.

BRIEF DESCRIPTION OF THE DRAWINGS

The drawings described herein are for illustrative purposes only of selected embodiments and not all possible implementations, and are not intended to limit the scope of the present application, in which:

FIGS. 5A-5C schematically illustrating a top view, cross-sectional views along lines I-I, II-II in FIG. 5A, of a pixel definition layer of a display panel in accordance with one or more embodiments of the present disclosure;

Corresponding reference numerals indicate corresponding parts or features throughout the several views of the drawings.

DETAILED DESCRIPTION

Figure 1A:
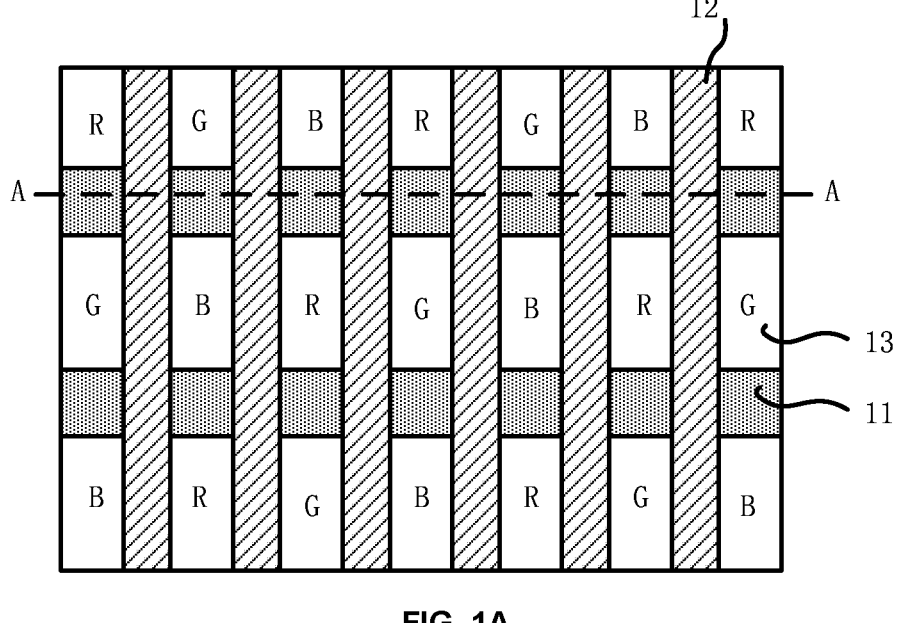
FIG. 1A schematically illustrates a plan view of a pixel bank pattern of a pixel definition layer and a pixel distribution formed by the pixel bank pattern.

Various embodiments, which are provided as exemplary examples of the present disclosure, will now be described in detail with reference to the accompanying drawings to enable those skilled in the art to implement the present disclosure.

It should be noted that the following accompanying drawings and examples are not meant to limit the scope of the present disclosure. Where particular elements of the present disclosure may be partially or fully implemented using known components, only those parts of such known components that are necessary for an understanding of the present disclosure will be described, and the detailed descriptions of other parts of such known components will be omitted so as not to confuse the present disclosure. Further, various embodiments encompass present and future known equivalents to the components referred to herein by way of illustration.

As used herein, the expressions "have", "comprise" and "contain" as well as grammatical variations thereof are used in a non-exclusive way. Thus, the expression "A has B" as well as the expression "A comprises B" or "A contains B" may both refer to the fact that, besides B, A contains one or more further components and/or constituents, and to the case in which, besides B, no other components, constituents, or elements are present in A. The terms "a", "an", "the", "said" and "at least one" are used to mean that there are one or more elements/components/etc.

As used herein, the term "be located on" does, however, not refer to a specific geometric orientation of the final stack in the display panel or the display device with respect to a direction of a gravitational force but rather indicates a way of manufacturing the stack, which, after manufacturing, could, in general, be placed in any geometric orientation, also such as turned upside down. The terms "first", "second", "third", etc. are used for descriptive purposes only and should not be construed to indicate or imply relative importance and order of formation.

In related technologies, an OLED display panel usually includes a substrate, a cathode, an anode, and a light-emitting layer (EML), etc. Under the action of the electric field, the holes generated by the anode and the electrons generated by the cathode will move, and migrate to the light-emitting layer. In the case that they meet in the light-emitting layer, energy excitons are generated, thereby exciting the light-emitting molecules to finally produce visible light.

The light-emitting modes of OLED display panel may be classified into a top-emission mode and a bottom-emission mode, where the top-emission mode has an advantage of high opening rate. In the case that the current OLED display panel generally has a problem of short life, high opening rate may alleviate display degradation due to the problem of short life. However, since the light emitted from the light-emitting layer passes through the cathode in the top-emission mode, the cathode may affect the light transmission rate in a certain extent. In order to improve the light transmission rate, the thickness of the cathode is generally thin, which leads to a relatively large surface resistance of the cathode. The large surface resistance of the cathode will cause inconsistent voltage drops at different locations, ultimately affecting the current in the OLED display panel and thus affecting the display uniformity.

In order to solve the problem of large surface resistance of the cathode, in the related technology, some auxiliary electrodes are disposed in the non-pixel areas of other layers of the display panel, and then the auxiliary electrodes are electrically connected to the cathode by mean of the auxiliary electrode holes. Generally, the auxiliary electrode holes are disposed in the pixel definition layer of the display panel so as not to affect the opening ratio of the display panel.

The pixel definition layer may include a plurality of first pixel definition strips and a plurality of second pixel definition strips that cross longitudinally and horizontally to define a plurality of pixel regions. In the relevant technology, depending on the pixel arrangement, the pixel definition layer of the OLED display panel may have two patterns, i.e., a pixel bank pattern in which the first pixel definition strip and the second pixel definition strip have substantially the same thickness; and a line bank pattern in which the thickness of the first pixel definition strip is smaller than the thickness of the second pixel definition strip.

Figure 1B:
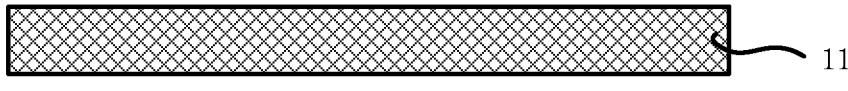
FIG. 1B schematically illustrates a cross-sectional view along line AA in FIG. 1A.

FIG. 1A schematically illustrates a plan view of a pixel bank pattern of a pixel definition layer and a pixel distribution formed by the pixel bank pattern; FIG. 1B schematically illustrates a cross-sectional view along the line AA in FIG. 1A. As shown in FIGS. 1A and 1B, in the pixel bank pattern, the first pixel definition strip 11 and the second pixel definition strip 12 have substantially the same thickness, such that when the light-emitting ink (i.e., light-emitting material) is printed, the light-emitting ink is confined within the pixel regions 13 defined by the first pixel definition strips 11 and the second pixel definition strips 12, thereby forming a pixel distribution shown in FIG. 1A, wherein adjacent pixel regions 13 may have different pixel colors. Alternatively, the pixel regions 13 between adjacent second pixel definition strips (i.e., the same column of pixel regions) may have the same pixel color.

Figure 2A:
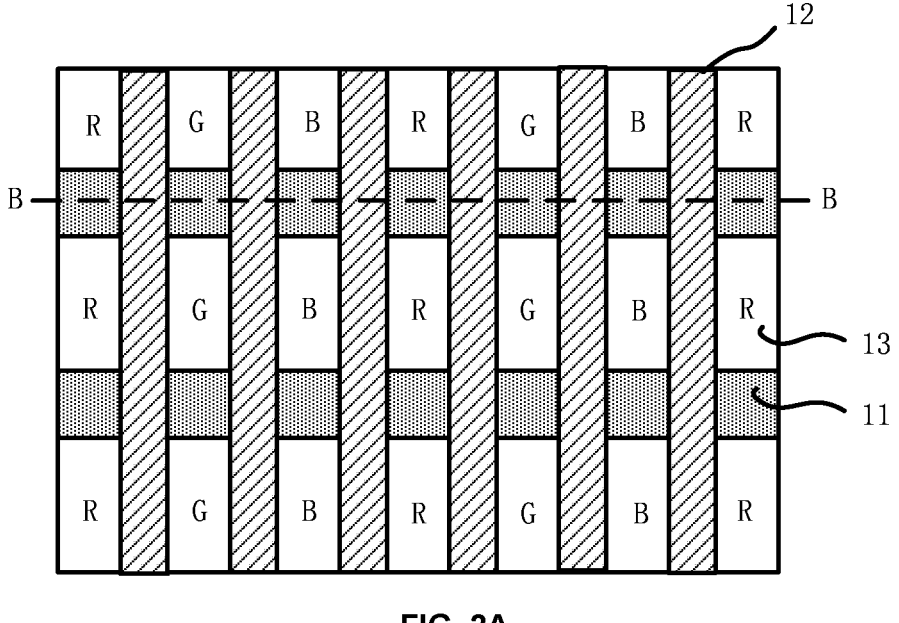
FIG. 2A schematically illustrates a plan view of a line bank pattern of a pixel definition layer and a pixel distribution formed by the line bank pattern.
Figure 2B:
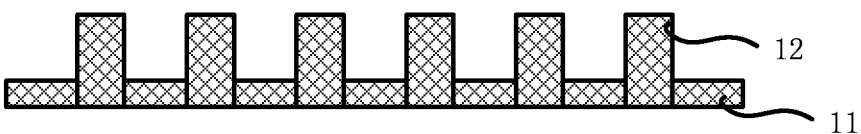
FIG. 2B schematically illustrates a cross-sectional view along line BB in FIG. 2A.

FIG. 2A schematically illustrates a plan view of a line bank pattern of a pixel definition layer and a pixel distribution formed by the line bank pattern; and FIG. 2B schematically illustrates a cross-sectional view along the line BB in FIG. 2A. As shown in FIGS. 2A and 2B, the thickness of the first pixel definition strip 11 is less than the thickness of the second pixel definition strip 12 in the line bank pattern. When ink of the light-emitting layer is printed into a channel between adjacent second pixel definition strips 12 in the line bank pattern, the ink may across the first pixel definition strip 11 and flow within the channel formed by the adjacent second pixel definition strips 12, thereby forming a pixel distribution as shown in FIG. 2B, wherein the pixel regions 13 belonging to the same channel may have the same pixel color and the pixel regions 13 belonging to adjacent channels may have different pixel colors.

In the case where an auxiliary electrode hole is provided in the pixel definition layer, whether the auxiliary electrode hole is provided in the first pixel definition strip or in the second pixel definition strip, the auxiliary electrode hole may cause an effective width of the first pixel definition strip or the second pixel definition strip where the auxiliary electrode hole is located to become narrower around the auxiliary electrode hole, that is, the auxiliary electrode hole wall is thinner. When ink of the light-emitting layer is printed into the pixel region defined by the pixel definition layer, the ink may overflow at the location of the auxiliary electrode hole, affecting the print quality. This risk is particularly evident in the configuration of the line bank pattern, since the auxiliary electrode hole is usually disposed in the second pixel definition strip with a larger thickness but narrower width. To reduce the risk of overflow, the size of the auxiliary electrode hole may be reduced. However, too small auxiliary electrode hole may lead to the problems of poor cathode-to-auxiliary cathode connection or high resistance. In addition, because of the narrow width of the second pixel definition strip, making holes therein is difficult, which has high requirements for exposure machine and material resolution, and is prone to cause a poor quality of the auxiliary electrode holes.

It is noted that in embodiments of the present disclosure, in order to facilitate printing ink in the pixel regions, the pixel regions defined by the first pixel definition strips and the second pixel definition strips may not be regular rectangles as shown in FIG. 1A and FIG. 2A, but other shapes, such as rounded rectangles. This means that at least one of the first pixel definition strips and the second pixel definition strips (in particular the first pixel definition strips) may not be regular strips, as shown in other accompanying drawings of the present disclosure.

An embodiment of the present disclosure provides a display panel which is may reduce the risk of ink overflowing from the auxiliary electrode hole wall into the auxiliary electrode hole due to the relatively thin the auxiliary electrode hole wall when light-emitting ink is printed, and may reduce the process requirements for providing the auxiliary electrode hole in the pixel definition layer.

Figure 3:
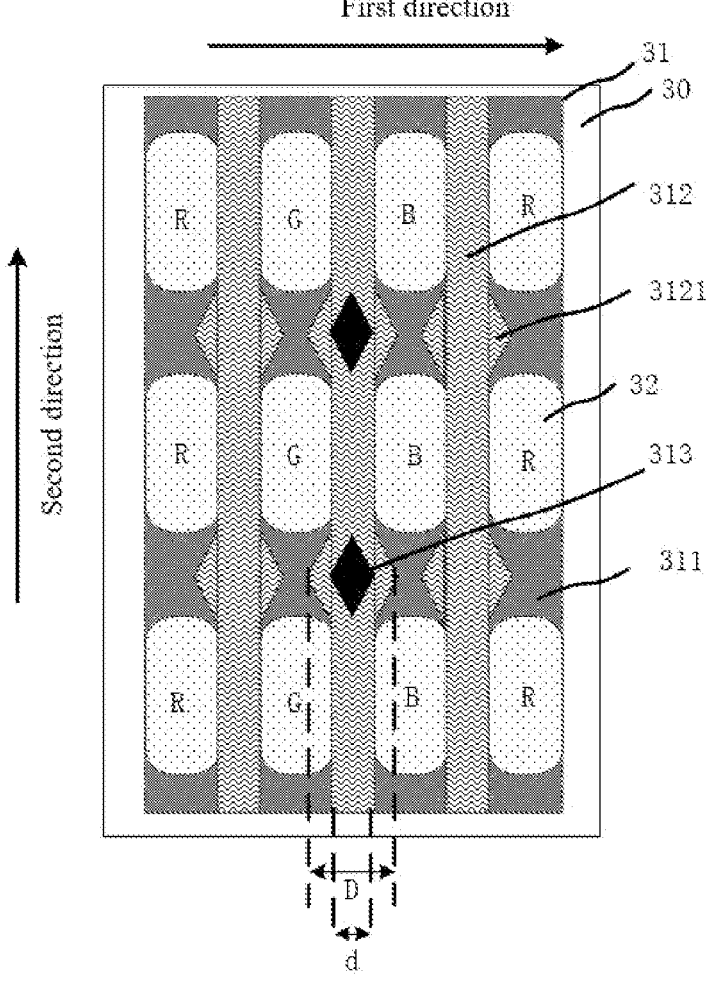
FIG. 3 schematically illustrates an exemplary display panel in accordance with one or more embodiments of the present disclosure.

FIG. 3 schematically illustrates an exemplary display panel 30 in accordance with one or more embodiments of the present disclosure. As shown in FIG. 3, the exemplary display panel includes a pixel definition layer 31 which includes a plurality of first pixel definition strips 311 extending in a first direction and arranged at intervals in a second direction perpendicular to the first direction; a plurality of second pixel definition strips 312 extending in the second direction and arranged at intervals in the first direction, wherein at least one of the plurality of second pixel definition strips 312 has at least one widened part 3121 which has a width D greater than a width d of the remaining part of the second pixel definition strip 312 to which the widened part 3121 belongs; and an auxiliary electrode hole 313 disposed in the at least one widened parts 3121. It shall be understood by those skilled in the art that, with respect to an individual pixel definition strip, the remaining part of the second pixel definition strip refers to the remaining part of the individual second pixel definition strip other than the widened part.

In embodiments of the present disclosure, the width of the widened part 3121 is a maximum width in the first direction, of any cross-section of the widened part 3121 parallel to a plane defined by the first direction and the second direction. As examples, in the case where the cross-section of the widened part 3121 has a circular shape, the width of the widened part 3121 is equal to the diameter of the circular shape; in the case where the cross-section of the widened part 3121 has an elliptical shape and its long axis is parallel to the extension direction of the second pixel definition strips 312, the width of the widened part 3121 is equal to a length of the short axis of the elliptical shape; in the case where the cross-section of the widened part 3121 has an elliptical shape and its short axis is parallel to the extension direction of the second pixel definition strips 312, the width of the widened part 3121 is equal to a length of the long axis of the elliptical shape; and in the case where the cross-section of the widened part 3121 has a diamond shape and one of the diagonals of the diamond shape is parallel to the extension direction of the second pixel definition stripe 312, the width of the widened part 3121 is equal to the length of the other of the diagonals of the diamond shape. It shall be understood that the cross-sectional shape of the widened part 3121 may also be otherwise regular or irregular shape, in which case the width of the widened part 3121 may be the maximum width in the first direction of the cross-section with other regular or irregular shape.

In embodiments of the present disclosure, one or more locations of the second pixel strip 312 are widened and the auxiliary electrode holes 313 are disposed in the widened parts 3121 of the second pixel definition strip 312, such that the effective width of the second pixel definition strip 312 at the auxiliary electrode hole 313 (i.e., the thickness of the wall around the auxiliary electrode hole) is relatively wide. Therefore, when light-emitting ink is printed on the pixel region, the risk of ink overflow is low. In addition, the process difficulty may be greatly reduced by disposing the auxiliary electrode hole at the widened part 3121 with a larger width (and thus a larger area).

Figure 4:
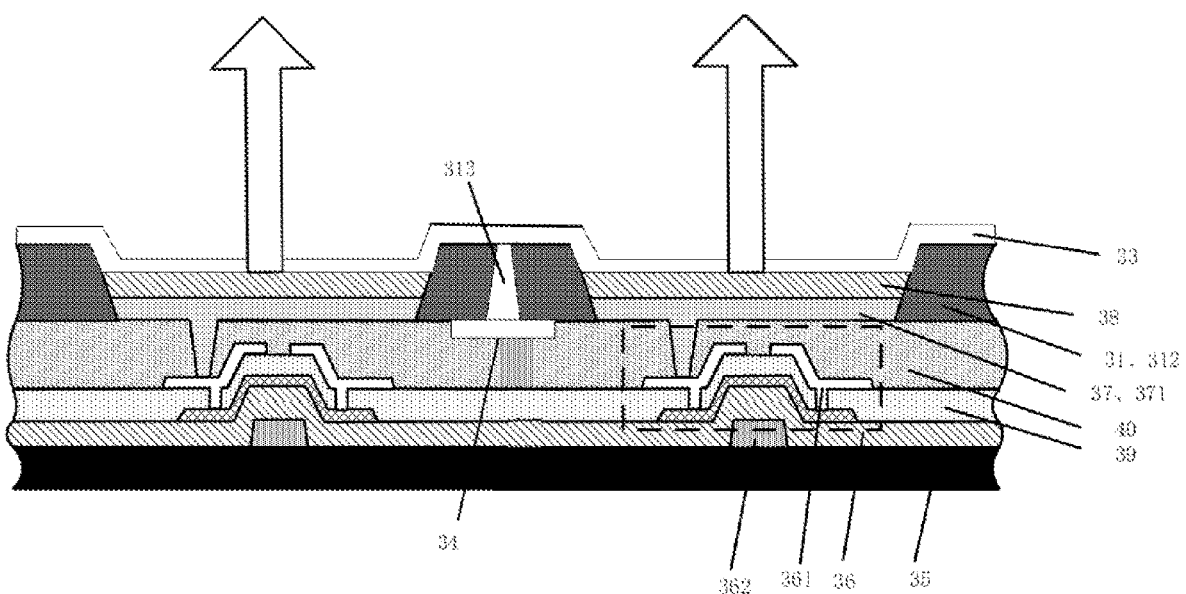
FIG. 4 schematically illustrates a cross-sectional view of an exemplary display panel in accordance with one or more embodiments of the present disclosure.

FIG. 4 schematically illustrates a cross-sectional view of an exemplary display panel 30 in accordance with one or more embodiments of the present disclosure. In an example embodiment, as shown in FIG. 4, the display panel 30 may include, in addition to the pixel definition layer 31, a substrate 35; an auxiliary electrode 34 disposed between the substrate 35 and the pixel definition layer 31; and a first electrode 33 disposed on the side of the pixel definition layer 31 away from the substrate 35. In this embodiment, the auxiliary electrode 34 and the first electrode 33 are electrically connected via a conductive material deposited in the auxiliary electrode hole 313. In this embodiment, the auxiliary electrode 34 and the first electrode 33 are electrically connected by a conductive material deposited in the auxiliary electrode hole 313. In this embodiment, the auxiliary electrode 34 is connected to the first electrode 33 through the auxiliary electrode hole 313, which is equivalent to connecting the first electrode 33 and the auxiliary electrode 34 in parallel, and thus the resistance of the first electrode 33 may be reduced.

Further referring to FIG. 4, the display panel 30 may further include a thin film transistor array including a plurality of thin film transistors (TFTs) 36 disposed on the substrate 35; a second electrode 37 disposed on a side of the thin film transistor array away from the substrate 35, the second electrode 37 including a plurality of second sub-electrodes 371, each second sub-electrode 371 having an orthographic projection on the substrate 35 overlapping an orthographic projection of the pixel region 32 defined by the first pixel definition strip 311 and the second pixel definition strip 312 on the substrate 35; and a light emitting material layer 38 disposed on a side of the plurality of second sub-electrodes 371 away from the substrate 35. In this embodiment, the first electrode 33 may be located on the side of the light emitting material layer 38 and the pixel definition layer 31 away from the substrate 35, and the auxiliary electrode 34 may be located on any of layers between the substrate 35 and the pixel definition layer 31. In an example embodiment, as shown in FIG. 4, the auxiliary electrode 34 may be located on the same layer as the source/drain electrode 361 of the thin film transistor 36 so that the auxiliary electrode is formed in the same process when the source/drain electrode of the thin film transistor is prepared. However, other embodiments are also feasible. As an example, the auxiliary electrode 34 may also be located on the same layer as the second electrode 37, or the gate 362 of the thin film transistor 36.

In some embodiments of the present disclosure, the material of the substrate 35 may be a semiconductor material such as monocrystalline silicon or polycrystalline silicon. In an alternative embodiment, the substrate 35 may also be made of other hard or soft materials such as glass, plastic, etc.

FIGS. 5A-5C schematically illustrate a top view, cross-sectional views along lines I-I, II-II in FIG. 5A, of a pixel definition layer 51 of a display panel in accordance with one or more embodiments of the present disclosure, respectively. In some embodiments of the present disclosure, as shown in FIG. 5A, the pixel definition layer 31 may include a plurality of first pixel definition strips 311 extending in a first direction and arranged at internals in a second direction perpendicular to the first direction; a plurality of second pixel definition strips 312 extending in the second direction and arranged at internals in the first direction, wherein at least one of the plurality of second pixel definition strips 312 has at least one widened part 3121, that has a width greater than a width of the remaining part of the second pixel definition strip 312 to which the widened part 3121 belongs, wherein the width of the at least one widened part 3121 is a maximum width in the first direction, of a cross-section of the at least one widened part 3121 parallel to a plane defined by the first direction and the second direction; and an auxiliary electrode hole 313 disposed in the at least one widened part 3121.

In one or more embodiments of the present disclosure, the pixel definition layer 31 may have a pixel bank pattern as shown in FIGS. 1A-1B, i.e., the thickness of the plurality of first pixel definition strips 311 is substantially equal to the thickness of the plurality of second pixel definition strips 312 in a third direction perpendicular to the first direction and the second direction.

In the configuration of the pixel bank pattern, at an intersection position of the first pixel definition strip 311 and the second pixel definition strip 312, the first pixel definition strip 311 itself may serve to widen the second pixel definition strip 312, so the widened part may be disposed at the intersection position of the second pixel definition strip 312 and the first pixel definition strip 311. In this case, it is possible to form the widened part by appropriately widening only the corners of the intersection position, or even by a part of the first pixel definition strip to widen the second pixel definition strip as the widened part of the second pixel definition strip without additional widened material, which may save the material for forming the widened part.

In further embodiment of the present disclosure, the pixel definition layer 31 may also have the line bank pattern shown in FIGS. 2A-2B. FIGS. 5B and 5C respectively illustrate cross-sectional views of the pixel definition layer along lines I-I and II-II in the case that the pixel definition layer in FIG. 5A has a line bank pattern. As shown in FIGS. 5B and 5C, the thickness of the plurality of first pixel definition strips 311 are less than the thickness of the plurality of second pixel definition strips 312. It should be noted that the auxiliary electrode 313 and the second electrode 37 are also shown in FIGS. 5B and 5C in order to clearly reflect the positional relationships between the components in the present disclosure.

In an example embodiment, the thickness of the first pixel definition strip 311 may be in the range of 0.1-1.0 μm, and the thickness of the second pixel definition strip 312 may be in the range of 0.5-50 μm.

In the configuration of the line bank pattern, the widened part 3121 may also be provided at the intersection position of the second pixel definition strip 312 and the first pixel definition strip 311. In this way, on the one hand, the effect of the widened part 3121 on the opening rate of the display panel is minimized, and on the other hand, the bottom of the widened part may borrow a part of the first pixel definition strip, which may save the material used to prepare the widened part.

In some embodiments of the present disclosure, as shown in FIG. 5A, each of the intersection positions of the plurality of first pixel definition strips 311 and the plurality of second pixel definition strips 312 may be provided with one widened part 3121. With this configuration, on the one hand, the pattern of the pixel definition layer is more uniform, which may facilitate the formation of the pixel definition layer; on the other hand, the consistency of the printing environment of different pixels may be ensured, which may facilitate printlight-emitting ink on the pixel region.

In some embodiments of the present disclosure, the number of widened parts 3121 provided with auxiliary electrode holes 313 is not less than 0.001-1 times the total number of pixel regions 32 defined by the plurality of first pixel definition strips 311 and the plurality of second pixel definition strips 312. By way of example, the number of widened parts 3121 provided with auxiliary electrode holes 313 may be equal to $\frac{1}{12}$-$\frac{1}{3}$ of the number of pixel regions 32 defined by the plurality of first pixel definition strips 311 and the plurality of second pixel definition strips 312. With this configuration, the resistance of the cathode of the display panel may be reduced without affecting the opening rate of the display panel.

In some embodiments, the first pixel definition strip 311 may include a hydrophilic material, for example, polyimide or acrylic. The second pixel definition strip 312 may include a hydrophobic material, for example, a fluorinated polyimide or sulfonimide. In the embodiment that the pixel definition layer has a line bank pattern, the liquidophilic nature of the first pixel definition strip 311 and the small thickness of the first pixel definition strip 312 facilitate the flow of ink across the first pixel definition strip 311 and within the channel defined by the adjacent second pixel definition strips 312 when light-emitting ink is printed; and the greater thickness of the second pixel definition strip 312 and the hydrophobic nature of the second pixel definition strip 312 facilitate to confine the ink within the channel defined by the adjacent second pixel definition strips 312 and avoid overflow of the ink into the adjacent channel.

With continued reference to FIG. 5A, in one or more embodiments of the present disclosure, a shape of the cross section of the widened part 3121 parallel to the plane defined by the first direction and the second direction may be selected such that a width of a channel formed between adjacent second pixel definition strips 312 gradually increases from the middle of the widened part toward any side of the widened part. With this configuration, the channel between adjacent second pixel definition strips 312 may be made to transition smoothly at the widened part, thereby facilitating the flow of ink in the channel between adjacent second pixel definition strips 312 when the ink is printed.

Figures 6A, 6B, 6C, 6D, 6E, 6F:
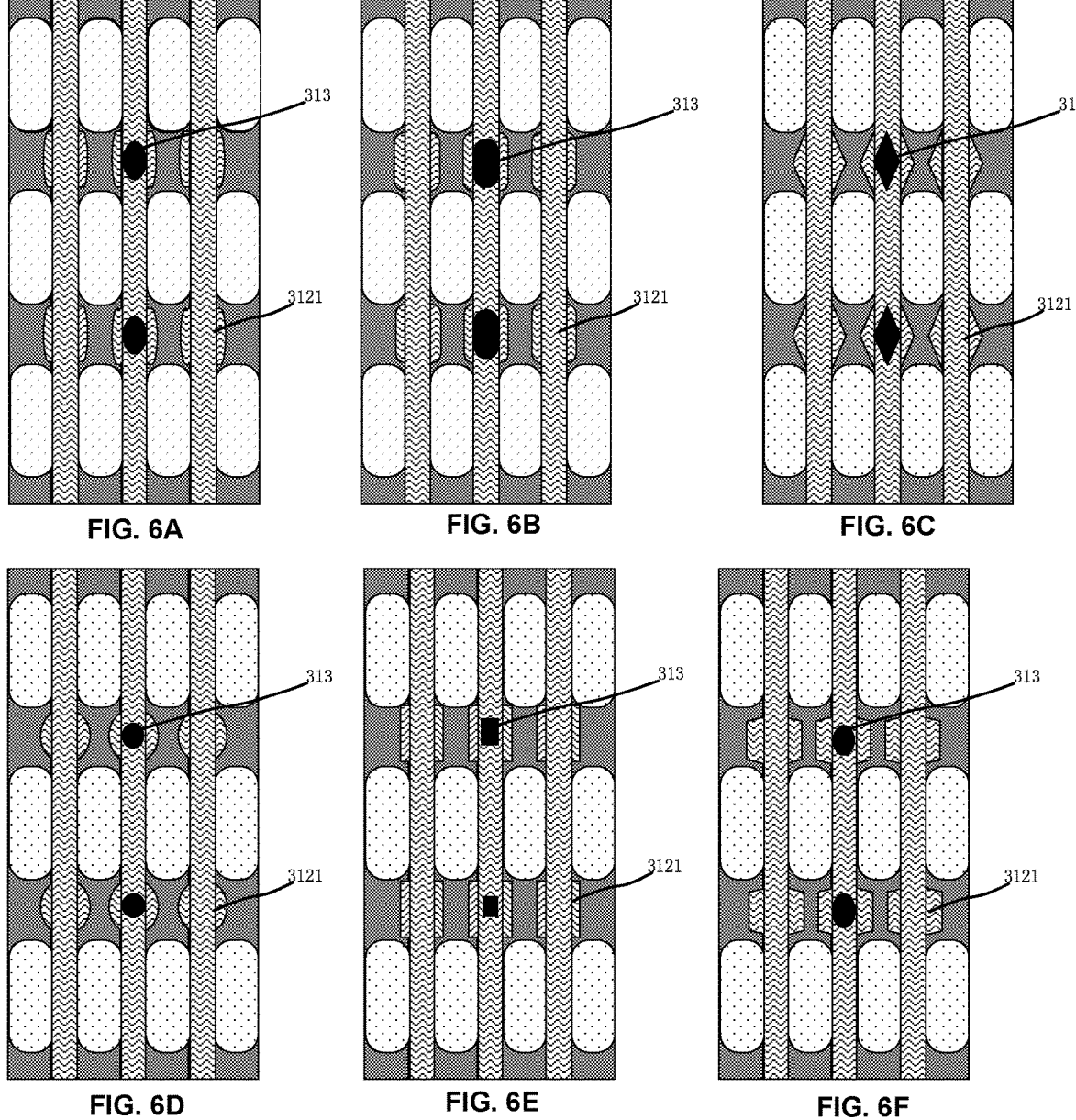
FIGS. 6A-6F schematically illustrate exemplary cross-sectional shapes of the widened part.

FIGS. 6A-6F schematically illustrate exemplary cross-sectional shapes of the widened parts. As shown in FIGS. 6A-6F, the cross-section of the widened part 3121 parallel to the plane defined by the first direction and the second direction may be one or more of a circle (FIG. 6D), an ellipse, a regular rectangle (FIG. 6E), a rounded rectangle (FIG. 6B), a curved-edge rectangle (FIGS. 6A and 6F), or a diamond (FIG. 6C). It shall be appreciated that the widened part may also have other cross-sectional shapes.

In one or more embodiments of the present disclosure, in order to ensure that the printed light-emitting ink flows smoothly within the channel defined by the adjacent second pixel definition strips 312, the width of said widened part 3121 is selected such that the minimum width of the channel between the widened parts of the adjacent second pixel definition strips 312 is not less than $\frac{1}{3}$, in particular $\frac{2}{3}$ of a width of each of the pixel regions defined by the plurality of first pixel definition strips 311 and the plurality of the second pixel definition strips 312. In an optional embodiment of the present disclosure, the width of the remaining part of each second pixel definition strip 312 is in the range of 5-15 μm, in particular, in the range of 10-15 μm. In an example embodiment, the difference between the width of the widened part 3121 of each of the second pixel definition strips 312 and the width of the remaining part of the second pixel definition strip is in the range of 1-100 μm, in particular, in the range of 20-80 μm.

In one or more embodiments of the present disclosure, the auxiliary electrode hole 313 formed in the widened part may have the same cross-sectional shape as the widened part 3121, as shown in FIGS. 6C-6E. It shall be appreciated that the auxiliary electrode hole 313 formed in the widened part may have a different cross-sectional shape than the widened part 3121, as shown in FIGS. 6A, 6B, and 6F.

With continued reference to FIG. 5C, in one or more embodiments of the present disclosure, the auxiliary electrode hole 313 formed in the widened part 3121 may have the same longitudinal cross-sectional shape as the widened part 3121. In one or more embodiments of the present disclosure, both the width of the widened part 3121 and the width of the auxiliary electrode hole 313 gradually increase along a direction from the first electrode 33 toward the auxiliary electrode 34. In an example embodiment, the longitudinal cross section of the widened part 3121 and the longitudinal cross section of the auxiliary electrode hole 313 are trapezoidal. With this configuration, due to a small opening at the top of the auxiliary electrode hole 313, the material of the organic insulating layer is not easily sputtered into the auxiliary electrode hole 313 when being vaporized on the pixel definition layer 31, so that the conductive material connecting the first electrode 33 and the auxiliary electrode 34 may be ensured to be continuous in the auxiliary electrode hole 313, thereby enabling a reliable connection between the first electrode 33 and the auxiliary electrode 34.

In some embodiments of the present disclosure, the first electrode 33 may be the cathode of the display panel and the second electrode 37 may be the anode of the display panel. In an example embodiment, the first electrode and the auxiliary electrode may include a transparent or translucent material, for example, indium tin oxide (ITO). The second electrode may include a metal or alloy material, for example, Mg and Ag; or Al and Li alloy. Of course, other alloys or monolithic metals may be used for the second electrode, which will not be listed herein.

In some embodiments of the present disclosure, as shown in FIG. 4, the display panel 30 may also include an etching barrier layer 39 disposed on the thin film transistor; a passivation layer 40 disposed on the etching barrier layer 39 and the source/drain electrode 361 of the thin film transistor 36.

In some embodiments of the present disclosure, there is further provided a display device including a display panel in accordance with one or more embodiments of the present disclosure, such as at least one display panel of one or more embodiments disclosed in detail above. Thus, for optional embodiments of the display device, reference may be made to embodiments of the display panel.

Figure 7:
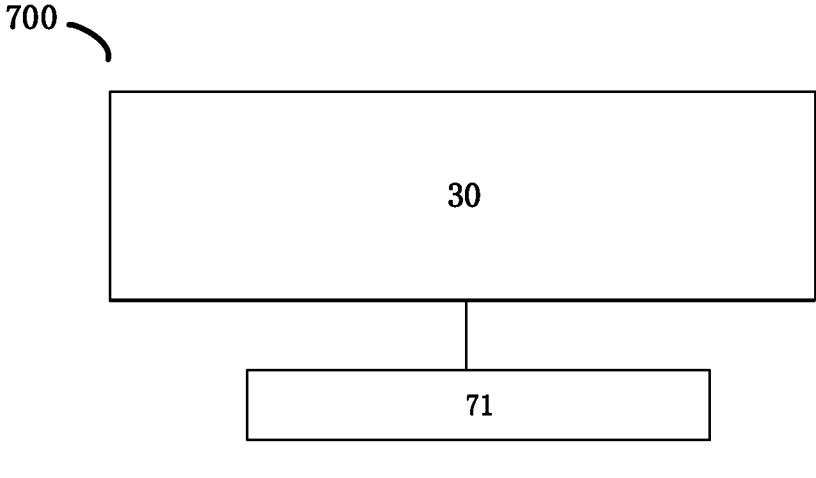
FIG. 7 schematically illustrates a display device in accordance with one or more embodiments of the present disclosure.

FIG. 7 schematically illustrates a display device 700 in accordance with one or more embodiments of the present disclosure. As shown in FIG. 7, the display device 700 may include a display panel 30 and a drive circuit 71 that provides drive signals for driving the display panel.

In some embodiments of the present disclosure, a method for preparing the display panel is further provided. Optionally, the method may prepare at least one display panel according to the present disclosure, such as at least one display panel according to one or more embodiments disclosed in more detail above and/or below. Thus, for optional embodiments of the method, reference may be made to embodiments of the display panel. The method includes the following steps, which may be performed in a given order or in a different order. In addition, additional method steps not listed may be provided. In addition, two or more or even all of the method steps may be performed at least partially simultaneously. In addition, the method steps may be repeatedly performed twice or even more than twice.

Figure 8:
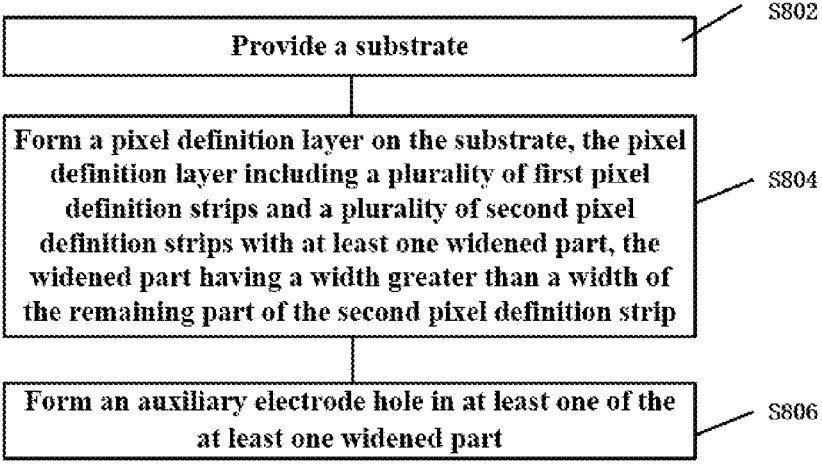
FIG. 8 schematically illustrates a flow chart of a method for preparing a display panel in accordance with one or more embodiments of the present disclosure.

FIG. 8 schematically illustrates a flowchart of a method for preparing a display panel in accordance with one or more embodiments of the present disclosure. As shown in FIG. 8, the method for preparing a display panel may include the following steps S802-S806. At step S802, a substrate is provided. At step 804, a pixel definition layer is formed on the substrate, the pixel definition layer including a plurality of first pixel definition strips extending in a first direction and arranged at internals in a second direction perpendicular to the first direction; a plurality of second pixel definition strips extending in the second direction and arranged at internals in the first direction, wherein at least one of the plurality of second pixel definition strips has at least one widened part, the widened part having a width greater than a width of the remaining part of the second pixel definition strip to which the widened part belongs, wherein the width of the widened part is a maximum width in the first direction, of a cross section of the widened part parallel to a plane defined by the first direction and the second direction. At step S806, an auxiliary electrode hole is formed in the at least one widened part.

It is understood that in one or more embodiments of the present disclosure, the method may further include the steps of forming other layers or components required for the display panel, including, for example, the steps of forming a thin film transistor, a second electrode, an auxiliary electrode, a light emitting material layer and a first electrode, respectively. Any method known to those skilled in the art may be used to form these components and will not be described in detail herein.

The foregoing description of the embodiment has been provided for purpose of illustration and description. It is not intended to be exhaustive or to limit the application. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the application, and all such modifications are included within the scope of the application.

The invention claimed is:

1. A display panel comprising a pixel definition layer which comprises:

a plurality of first pixel definition strips extending in a first direction and arranged at intervals in a second direction perpendicular to the first direction;

a plurality of second pixel definition strips extending in the second direction and arranged at intervals in the first direction, wherein at least one of the plurality of second pixel definition strips has at least one widened part, which has a width greater than a width of a remaining part of the respective second pixel definition strip to which the widened part belongs, and wherein the width of the widened part is a maximum width, in the first direction, of a cross-section of the widened part parallel to both the first direction and the second direction; and an auxiliary electrode hole disposed in the at least one widened part.

2. The display panel according to claim 1, further comprising:

a substrate;

an auxiliary electrode disposed between the substrate and the pixel definition layer; and a first electrode disposed on a side of the pixel definition layer away from the substrate, wherein the auxiliary electrode is electrically connected to the first electrode via a conductive material deposited in the auxiliary electrode hole.

3. The display panel according to claim 2, wherein at least one of the plurality of second pixel definition strips has a thickness in a third direction perpendicular to the first direction and the second direction greater than a thickness of at least one of the plurality of first pixel definition strips.

4. The display panel according to claim 3, wherein the thickness of the first pixel definition strip is in the range of 0.1-1.0 μm and the thickness of the second pixel definition strip is in the range of 0.5-50 μm.

5. The display panel according to claim 3, wherein the at least one widened part is located at intersection positions of the plurality of second pixel definition strips and the plurality of first pixel definition strips.

6. The display panel according to claim 5, wherein each of the intersection positions of the plurality of second pixel definition strips and the plurality of first pixel definition strips is provided with the widened part.

7. The display panel according to claim 1, wherein the number of the widened parts provided with the auxiliary electrode holes is not less than 0.001-1 times the total number of pixel regions defined by the plurality of first pixel definition strips and the plurality of second pixel definition strips.

8. The display panel according to claim 3, wherein a shape of the cross-section of the widened part is designed such that a width of a channel formed between adjacent second pixel definition strips gradually increases from the middle of the widened part toward any side of the widened part.

9. The display panel according to claim 3, wherein the cross section of the widened part parallel to both the first direction and the second direction is one or more of a circle, an ellipse, a regular rectangle, a rounded rectangle, a curved-edge rectangle, or a diamond shape.

10. The display panel according to claim 3, wherein the width of the widened part is designed such that a minimum width of the channel formed between the widened parts of the adjacent second pixel definition strips is not less than ⅓ of a width of a pixel region defined by the pixel definition layer between the adjacent second pixel definition strips.

11. The display panel according to claim 1, wherein the width of the remaining part of each of the second pixel definition strips is in the range of 5-15 μm, and a difference between the width of the widened part of each of the second pixel definition strips and the width of the remaining part is in the range of 1-100 μm.

12. The display panel according to claim 1, wherein the auxiliary electrode hole has a same cross-sectional shape as the respective widened part where the auxiliary electrode hole is disposed.

13. The display panel according to claim 2, wherein the width of the widened part and the width of the auxiliary electrode hole gradually increase in a direction from the first electrode toward the auxiliary electrode.

14. The display panel according to claim 13, wherein the widened part and the auxiliary electrode hole have trapezoidal longitudinal cross sections perpendicular to both the first direction and the second direction.

15. The display panel according to claim 1, wherein the plurality of first pixel definition strips comprise a hydrophilic material and the plurality of second pixel definition strips comprise a hydrophobic material.

16. The display panel according to claim 15, wherein the hydrophilic material comprises polyimide or acrylic, and wherein the hydrophobic material comprises fluorinated polyimide or sulfonimide.

17. The display panel according to claim 2, further comprising:
  a thin film transistor array comprising a plurality of thin film transistors disposed on the substrate;
  a second electrode disposed on a side of the thin film transistor array away from the substrate, the second electrode comprising a plurality of second sub-electrodes, whose orthographic projections on the substrate respectively overlaps orthographic projections, on the substrate, of a plurality of pixel regions defined by the pixel definition layer; and
  a light emitting material layer disposed on a side of the plurality of second sub-electrodes away from the substrate,
  wherein the first electrode is disposed on a side of the light emitting material layer away from the substrate.

18. The display panel according to claim 17, wherein the auxiliary electrode is insulatedly located on a same layer as any of the second electrode, a source/drain electrode of the thin film transistor, or a gate of the thin film transistor.

19. A display device comprising a display panel according to claim 1.

20. A method for preparing a display panel comprising:
  providing a substrate;
  forming a pixel definition layer on the substrate, the pixel definition layer comprising a plurality of first pixel definition strips extending in a first direction and arranged at intervals in a second direction perpendicular to the first direction; a plurality of second pixel definition strips extending in the second direction and arranged at intervals in the first direction, wherein at least one of the plurality of second pixel definition strips has at least one widened part which has a width greater than a width of a remaining part of the respective second pixel definition strip to which the widened part belongs, wherein the width of the widened part is a maximum width, in the first direction, of a cross section of the widened part parallel to both the first direction and the second direction; and
  forming an auxiliary electrode hole disposed in the at least one widened part.

* * * * *